United States Patent
Patil et al.

(10) Patent No.: US 9,071,257 B2
(45) Date of Patent: Jun. 30, 2015

(54) SYSTEMS AND METHODS FOR DERIVATIVE LEVEL-CROSSING SAMPLING

(71) Applicant: THE TRUSTEES OF COLUMBIA UNIVERSITY IN THE CITY OF NEW YORK, New York, NY (US)

(72) Inventors: Sharvil Pradeep Patil, New York, NY (US); Yannis Tsividis, New York, NY (US); Pablo Martinez Nuevo, New York, NY (US)

(73) Assignee: THE TRUSTEES OF COLUMBIA UNIVERSITY IN THE CITY OF NEW YORK, New York, NY (US)

( * ) Notice: Subject to any disclaimer, the term of this patent is extended or adjusted under 35 U.S.C. 154(b) by 0 days.

(21) Appl. No.: 14/326,737

(22) Filed: Jul. 9, 2014

(65) Prior Publication Data

US 2015/0015429 A1    Jan. 15, 2015

Related U.S. Application Data

(60) Provisional application No. 61/982,042, filed on Apr. 21, 2014, provisional application No. 61/844,237, filed on Jul. 9, 2013.

(51) Int. Cl.
*H03M 7/00*     (2006.01)

(52) U.S. Cl.
CPC ...................................... *H03M 7/00* (2013.01)

(58) Field of Classification Search
CPC ....... H03M 1/12; H03M 3/022; H03M 3/424; H03M 3/438; H03M 7/3022; H03M 7/3026; H03M 7/3033; H03M 2201/1136; H03M 3/30; H03M 7/00
USPC .......................................... 341/143, 200, 155
See application file for complete search history.

(56) References Cited

U.S. PATENT DOCUMENTS

| | | | | |
|---|---|---|---|---|
| 3,582,784 A | * | 6/1971 | Gaunt, Jr. ....................... | 375/249 |
| 5,191,332 A | * | 3/1993 | Shieu ............................. | 341/143 |
| 7,394,418 B2 | * | 7/2008 | Eikenbroek ................... | 341/143 |
| 2010/0195770 A1 | | 8/2010 | Ricci et al. | |
| 2011/0066053 A1 | | 3/2011 | Yazicioglu | |
| 2013/0287136 A1 | * | 10/2013 | Martinez Nuevo et al. .. | 375/285 |

* cited by examiner

*Primary Examiner* — Jean B Jeanglaude
(74) *Attorney, Agent, or Firm* — Wilmer Cutler Pickering Hale and Dorr LLP

(57) ABSTRACT

The derivative of an input signal is level-crossing-sampled and the resulting samples are transmitted. At the receiver, the resulting samples are fed to a zero-order hold followed by an integrator, which results in piecewise-linear reconstruction. The systems and methods are further refined to reduce the number of samples generated per unit of time, compared to methods based on zero-order-hold reconstruction, for a given signal-to-error ratio, without significant hardware overhead.

16 Claims, 8 Drawing Sheets

| Test Signal | System | SER (dB) | $N_z$ (S/s) | $FOM = \dfrac{N_z}{SER \times f}$ |
|---|---|---|---|---|
| One tone @100Hz | LCS | 37.6 | 12,400 | 1.63 |
| | DLCS | 21.3 | 400 | 0.34 |
| | AR DLCS | 63.1 | 5,400 | 0.04 |
| One tone @3.9kHz | LCS | 37.6 | 483,600 | 1.63 |
| | DLCS | 66.5 | 483,600 | 0.06 |
| | AR DLCS | 62.9 | 220,200 | 0.041 |
| Two tones @200Hz and 2kHz | LCS | 34.7 | 126,400 | 2316$f$ |
| | DLCS | 42.7 | 63,200 | 463.1$f$ |
| | AR DLCS | 57.5 | 71,000 | 94.7$f$ |
| 4kHz-bandlimited random Gaussian (HPF cutoff: 100Hz) | LCS | 29.1 | 86,000 | 3016$f$ |
| | DLCS | 38.2 | 125,100 | 1535$f$ |
| | AR DLCS | 49.2 | 107,500 | 374$f$ |
| ECG (HPF cutoff: 0.5Hz) | LCS | 27 | 139.3 | 6.22$f$ |
| | DLCS | 29.1 | 166.1 | 5.79$f$ |
| | AR DLCS | 50.8 | 180.7 | 0.52$f$ |
| Speech (HPF cutoff: 300Hz) | LCS | 23.1 | 11,930 | 835$f$ |
| | DLCS | 27 | 15,530 | 693.7$f$ |
| | AR DLCS | 49.8 | 28,500 | 91.7$f$ |

Fig. 9

SYSTEMS AND METHODS FOR DERIVATIVE LEVEL-CROSSING SAMPLING

CROSS REFERENCE TO RELATED APPLICATIONS

This application claims priority under 35 U.S.C. §119(e) of U.S. Provisional Application No. 61/982,042, filed Apr. 21, 2014, entitled "DERIVATIVE LEVEL-CROSSING SAMPLING," and U.S. Provisional Application No. 61/844,237, filed Jul. 9, 2013, entitled "ADAPTIVE-RESOLUTION DERIVATIVE LEVEL-CROSSING SAMPLING," the entire contents of both applications are incorporated by reference herein in their entirety.

This application is related to U.S. patent application Ser. No. 13/874,215, entitled "Systems, Devices, and Methods for Continuous Time Signal Processing," the contents of which are incorporated by reference herein in their entirety.

BACKGROUND

As electronic devices become ubiquitous, several applications demand signal processing and transmission with as little power dissipation as possible. For example, wireless sensor networks consist of a number of sensor nodes that sense, process, transmit, and receive information wirelessly; they must often do so under severe constraints in terms of energy usage, whether such energy is derived from a small, difficult-to-replace battery, or through energy harvesting techniques. In such applications, it is important to minimize the power budget in sampling, processing, and transmission of data. In some cases, communication may take place locally, for example, from sensor node to sensor node in a network, and then the power budget at the receiving end is important as well.

Conventional sampling and processing occur at a fixed sampling rate, as dictated by the Shannon theorem, which states that the samples of a band-limited signal, taken at a rate twice its highest frequency component, are sufficient to completely represent and reconstruct the signal from the samples. The sampling frequency in fixed sampling rate systems is set according to this principle. However, some signals have frequency spectra that change significantly with time. When the signal frequency decreases, the above uniform sampling rate needlessly wastes samples and results in wasted energy in processing, transmission, and reception. Accordingly, there is a need for non-uniform sampling techniques that address this problem.

SUMMARY

Systems and methods for reconstructing an input signal are provided. According to aspects of the disclosure, a system for reconstructing an input signals can include a first differentiator configured to receive the input signal and generate a first signal representing the first derivative of the input signal. The system can also include a second differentiator configured to receive the first signal and generate a second signal representing the second derivative of the input signal and a controller configured to receive the second signal and generate a quantization step. A level-crossing sampling block can be configured to receive the first signal and the quantization step and generate level-crossed samples of the first signal. A zero-order holding block can be configured to receive the level-crossed samples and the quantization step and generate a quantized signal. The disclosed system can also include an integrator configured to receive the quantized signal and the quantization step and generate a third signal representing a reconstructed signal of the input signal.

According to alternative aspects of the present disclosure, a system for reconstructing an input signal can include a differentiator configured to receive the input signal and generate a first signal representing the first derivative of the input signal. The system can also include a level-crossing sampling block configured to receive the first signal and generate level-crossed samples, a zero-order holding block configured to receive the level-crossed samples and generate a quantized signal, and an integrator configured to receive the quantized signal and generate a second signal representing a reconstructed signal of the input signal. In the disclosed system, the quantizer is configured to generate the quantized signal using non-uniform quantization.

BRIEF DESCRIPTION OF DRAWINGS

FIG. 9 shows a table with performance comparison of LCS (6b), DLCS (6b), and AR DLCS (average resolution 5.7b) for different input signals.

DETAILED DESCRIPTION

Figure 1:
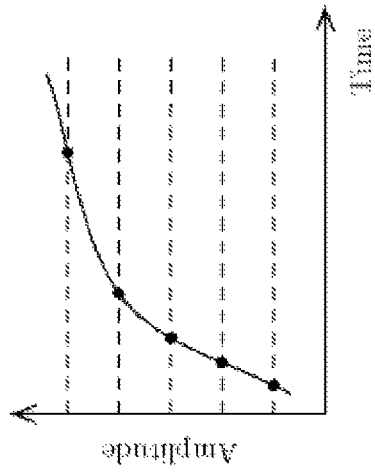
FIG. 1 shows different sampling levels in a level-crossing sampling (LCS) technique.

Level-crossing sampling (LCS) is a sampling technique, in which sampling is performed each time a signal crosses a threshold. FIG. 1 illustrates this. Specifically, FIG. 1 shows a graph of the amplitude of the signal as a function of time and different sampling levels. This type of sampling scales the inter-sample interval automatically, depending on the slope of the signal. When the input is idle, no samples are wasted, without the need for elaborate power-down scenaria. This type of sampling has better quantization error properties than conventional sampling and does not suffer from aliasing. Ideally, no clock is necessary in this technique, and this can result in power savings, with all circuitry operating in continuous time. Techniques to process the resulting signal digitally in continuous time have been demonstrated, with the resulting event-driven processors offering certain advantages complementary to those of conventional processors.

Figure 2:
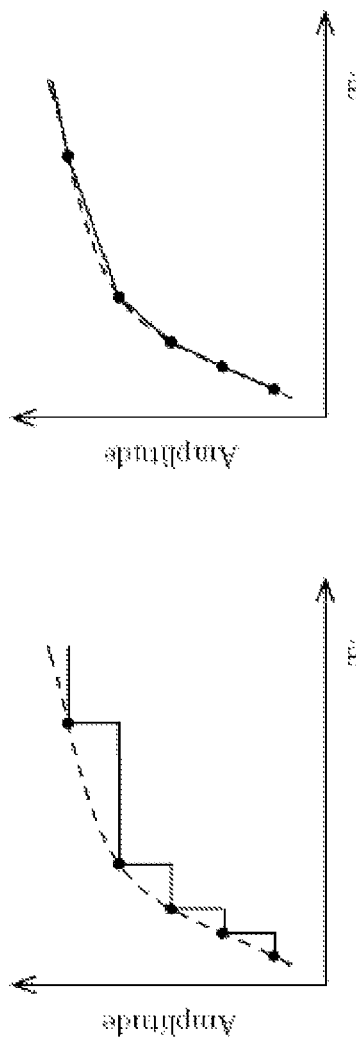
FIG. 2(a) shows an exemplary zero-order-hold (ZOH) reconstruction technique.
FIG. 2(b) shows an exemplary first-order reconstruction technique.

Prior art LCS techniques are based on zero-order-hold (ZOH) reconstruction at the receiver, as shown in FIG. 2(a). Other prior art techniques employ computationally intensive reconstruction techniques. However, in applications where the receiver is on a tight power budget, such techniques constitute a serious power overhead.

FIG. 2(b) shows a piecewise linear reconstruction of the signal, which can result in significantly smaller error compared to a ZOH reconstruction. For example, using a sinusoidal input and an 8-bit resolution results in a signal-to-error ratio of 49 dB in the case of the zero-order hold, and 73 dB in the case of first-order reconstruction. Unfortunately, first-order reconstruction is non-causal; to know the value of the signal at a given instant between two samples, one needs to know the value of the sample following that instant. This type of reconstruction thus necessitates storing the signal, which results in an unavoidable delay. In addition, the need for storage plus the computational hardware required for first-order interpolation results in significant hardware overhead. First-order prediction techniques can be used to avoid the above non-causality, but those can result in discontinuities and they, too, imply a significant computational overhead.

According to aspects of the disclosure, methods and systems for level-crossing sampling and reconstruction are disclosed. According to a disclosed method, which is called derivative level-crossing sampling (DLCS), the derivative of the input signal is level-crossing-sampled, and the resulting samples are transmitted. At the receiver, the samples are fed to a zero-order hold followed by an integrator, automatically resulting in piecewise-linear reconstruction, which can have much lower quantization error than zero-order hold reconstruction. The disclosed systems and methods are further refined to result in two additional schemes, namely "companded DLCS" and "adaptive-resolution DLCS." The disclosed methods and systems can significantly reduce the number of samples generated per unit of time, compared to schemes based on zero-order-hold reconstruction, for a given signal-to-error ratio, without significant hardware overhead. This can be achieved without the need for elaborate reconstruction techniques, such as linear prediction. Contrary to Nyquist-rate-clocked systems, DLCS and its variants exploit the varying spectral context and sparse structure of bursty signals, by generating samples only when the signal rate of change requires it, thus leading to low dynamic power dissipation in the associated hardware.

Derivative Level-Crossing Sampling

Figure 3:
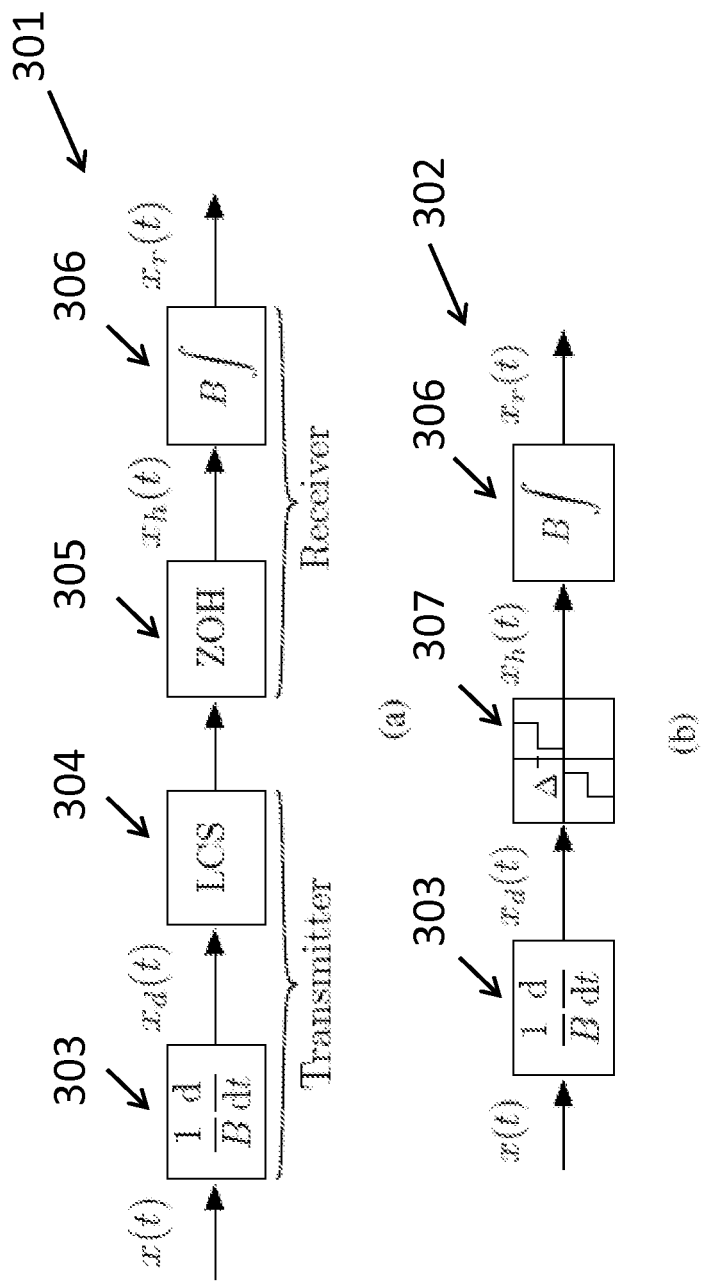
FIG. 3(a) shows an exemplary derivative level-crossing sampling (DLCS) scheme.
FIG. 3(b) shows a conceptually equivalent system to a derivative level-crossing sampling scheme.
Figure 4:
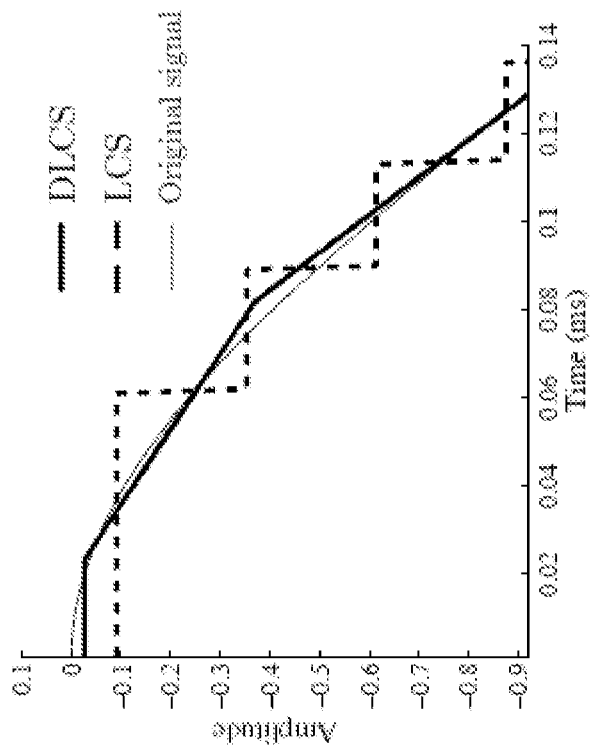
FIG. 4 shows a comparison of a DLCS and an LCS system output signal with the original signal.

A Derivative Level-Crossing Sampling (DLCS) system is shown at FIG. 3(a) generally at 301. FIG. 3(a) shows at the transmitter side a differentiator with scaling 303 and a level-crossing sampler 304. At the receiver side, FIG. 3(a) shows zero-order hold block 305 and an integrator with scaling 306. Specifically, at the transmitter, the input signal x(t) is scaled and differentiated, and the result is level-crossing-sampled. The resulting samples are transmitted to the receiver. At the receiver, the received samples are fed to the zero-order hold block 305, and then are passed to an integrator. The integrator can compensate for the differentiator 303. Because of the integration, piecewise-linear reconstruction is automatically achieved without any additional hardware, which results in a much smaller quantization error. Thus, the scheme can achieve first-order reconstruction, which can lead to a lower reconstruction error, in real time without the need of any linear predictor or non-causal techniques. FIG. 4 shows a comparison of the output of the DLCS system with the output of an LCS system with zero-order reconstruction and with the original signal.

For purposes of analyzing the system in FIG. 3(a), the two middle blocks, LCS 304 and ZOH 305 can be conceptually combined into a quantizer, as shown in FIG. 3(b), generally at 302.

According to aspects of the present disclosure, an implementation for DLCS can use an LCS quantizer preceded by an OPAMP-based differentiator circuit. Reconstruction can be accomplished using an OPAMP-based integrator circuit.

Additional assumptions for purposes of analyzing the disclosed system, without limiting the scope, include an input signal x(t) that is band-limited to B rad/s, bounded so that $|x(t)| \leq M$, where M is a positive number, and the derivative of the input signal is assumed to satisfy a zero initial condition, $x_d(0)=0$. As the input signal is band-limited, its derivative is bounded; using Bernstein's inequality (if f (z) is an entire functions of exponential type (EFET) of type $\sigma > 0$ such that $|f(t)| \leq M$, then $|f(t)| \leq \sigma M$), a person of ordinary skill would conclude that $|dx/dt|$ is bounded by the product BM. Therefore, the quantizer has an input range of $[-M, M]$. For the purposes of the analysis, a mid-tread quantizer is used.

Consider a signal x(t) and its reconstructed version, $x_r(t)$. The mean square error (MSE) in the reconstructed signal can be found by comparing it to the original signal, while at the same time not penalizing for amplitude, DC offset, and delay errors. Thus, the MSE can be found by minimization, as shown by the following equation:

$$MSE = \min_{a,b,\tau} \overline{(x_r(t) - (ax(t-\tau) + b))^2} \quad (1)$$

where the overline denotes time average. Then, the signal-to-error power ratio (SER), with both signal and error as root-mean-square "rms" quantities, is given by the square root of the corresponding power ratio:

$$SER = \sqrt{\frac{\overline{x(t)^2}}{MSE}} \quad (2)$$

The corresponding number of decibels is given by 20 log SER.

According to Parseval's theorem, this time-domain calculation gives the same result as a Fourier analysis of the reconstructed signal, in which the power of all spectral components at frequencies different from that of the input (not including a possible 0-frequency component) is compared to the power of the component at the frequency of the input (a single-frequency input is assumed for simplicity). This results in a very conservative estimate, given that in LCS the error frequency components are all at harmonic frequencies, many of which will normally fall out-of-band.

Figure 5:
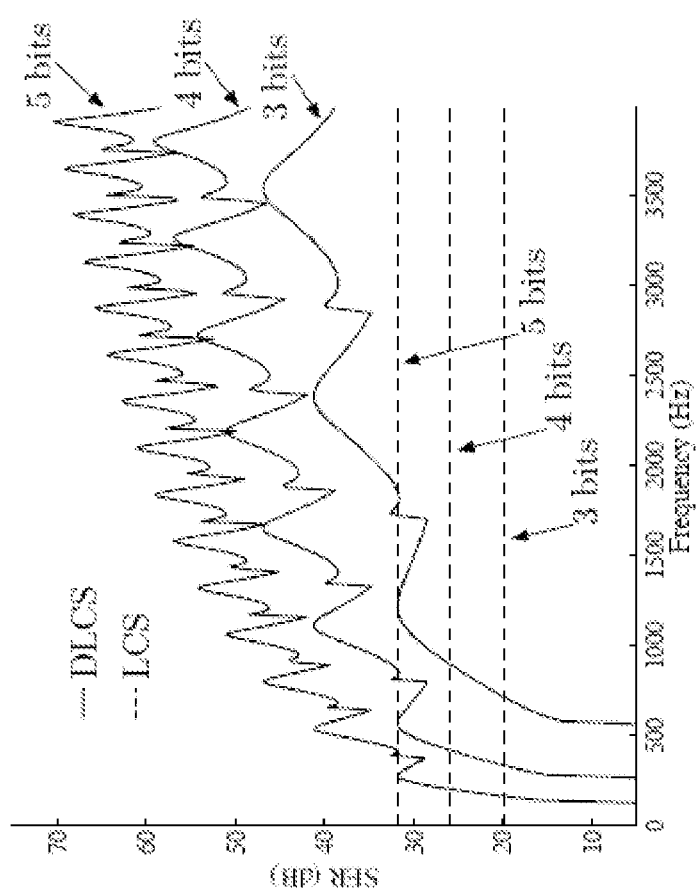
FIG. 5 shows a graph depicting the signal-to-error ratio (SER) for full-scale sinusoids using DLCS reconstruction, according to aspects of the present disclosure.

FIG. 5 shows a graph the SER of DLCS versus frequency in the voice band for different resolutions. The behavior of DLCS is shown by the solid lines. The overall drop in SER as frequency is decreased can be explained by noting that, for a fixed-amplitude sinusoid, the derivative $x_d(t)$ has an amplitude which is proportional to the frequency; thus, at low frequencies, fewer quantization levels are spanned, resulting in an coarser effective quantization. The non-monotonicity of the curves is consistent with similar non-monotonicity in conventional quantization; it is known that when the peak of a signal at the input of a quantizer is near a quantization threshold, and is varied around that value, large local variations in the SER occur. This is to be contrasted with the behavior of classical LCS which, assuming zero-order reconstruction, is equivalent to quantization and has the well-known value of 6.02N+1:76 dB over infinite bandwidth independent of frequency. The values of SER for classical LCS are shown by the dashed lines in FIG. 5. The DLCS system outperforms the classical LCS system of the same resolution over most of the frequency range.

Compressed and Expanded ("Companded") DLCS

According to aspects of the present disclosure, the performance of the DLCS system can improve at low frequencies, using non-uniform quantization, in which the low values of the derivative that occur at such frequencies are quantized with higher resolution. A compressing and expanding ("companding") technique can be used. However, in contrast to prior are companding techniques, the disclosed systems and methods compress and expand the derivative of the signal; not the signal itself. In addition, the disclosed methods and systems can use low derivative values, for example, derivative values up to 0.18 of full scale. For higher derivative values, uniform quantization is used. Therefore there is no sacrifice in the achievable SER. Since the derivative amplitude is proportional to input frequency, this approach results in better SER at low input frequencies. Simulation results for this approach, termed "companded DLCS", will be presented after adaptive—resolution DLCS is described below.

Adaptive-Resolution DLCS (AR DLCS)

A. AR DL CS System Description

Figure 6:
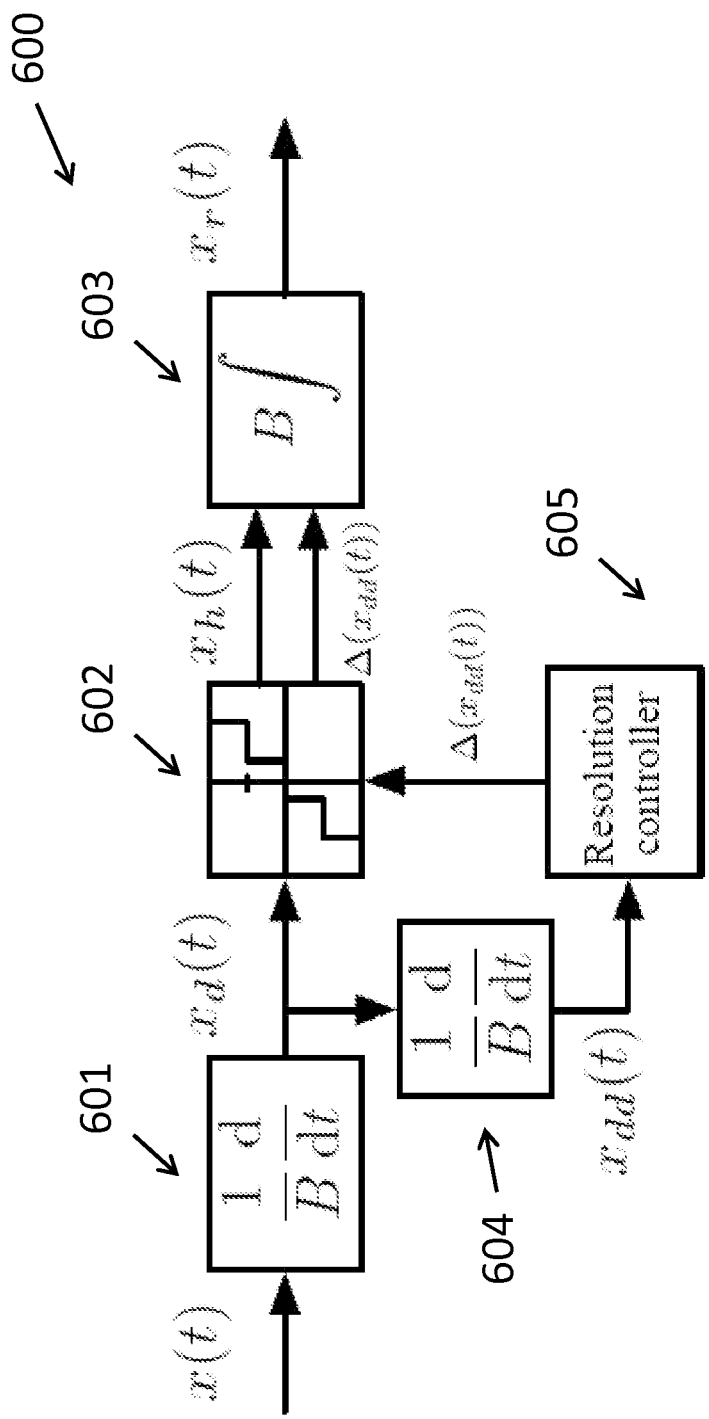
FIG. 6 shows an exemplary adaptive-resolution derivative level-crossing sampling system, according to aspects of the present disclosure.

The companded DLCS can further be refined by making the resolution of the quantizer adaptive. According an embodiment of the present disclosure, the quantizer resolution can depend on the first derivative of the signal being quantized. This approach reduces the number of samples per second, while it does not affect in-band error. According to alternative embodiments, the quantizer resolution can depend on the second derivative, as shown in FIG. 6. FIG. 6 shows an exemplary implementation 600 of the AR DLCS system. FIG. 6 shows a first differentiator 601, a second differentiator 604, a quantizer 602, a resolution controller 605, and an integrator 603. The input signal x(t) passes through first differentiator 601 to generate the first derivative of the input signal, $x_d(t)$. The first derivative signal is then fed to quantizer 602 and to a second differentiator 604. The second differentiator 604 generates signal $x_{dd}(t)$, which is the second derivative of the input signal x(t). Signal $x_{dd}(t)$ is fed to resolution controller 605, which generates an appropriate quantization step $\Delta(x_{dd}(t))$. Quantizer 602 receives signal $x_d(t)$ and quantization step $\Delta(x_{dd}(t))$ and generates a quantized signal $x_h(t)$ and further passes the received quantization step $\Delta(x_{dd}(t))$ to the integrator 603. The integrator 603 generates the reconstructed signal $x_r(t)$.

When the magnitude of the input second derivative is small, a small quantization step is used; the step size is increased as the absolute value of the second derivative increases. This approach results in fine resolution during intervals in which $x_d(t)$ is relatively flat, which is important because the corresponding difference in equation (1) lasts longer during such intervals, and a coarse resolution during such intervals would deteriorate the MSE. In the resulting adaptive-resolution DLCS (AR DLCS), the resolution varies significantly; however, the average resolution can be significantly lower than the highest resolution.

In the system of FIG. 6, information on the quantization step size, $\Delta(x_{dd}(t))$, along with the quantized signal $x_h(t)$ for reconstruction purposes at the receiver. As a consequence, this scheme adds some information overhead to a given sample and increases the sample size.

B. AR DLCS System Description Design Procedure

Using the lowest-frequency input, the disclosed systems and methods determine the resolution to achieve a SER target at the receiver. With such lowest-frequency input, the second derivative is small throughout, hence demanding a high resolution; this is the highest resolution needed. According to aspects of the present disclosure, the input frequency is increased, and for portions of the input where its second derivative is large, the quantization step is increased while keeping the SER above our target.

Figure 7:
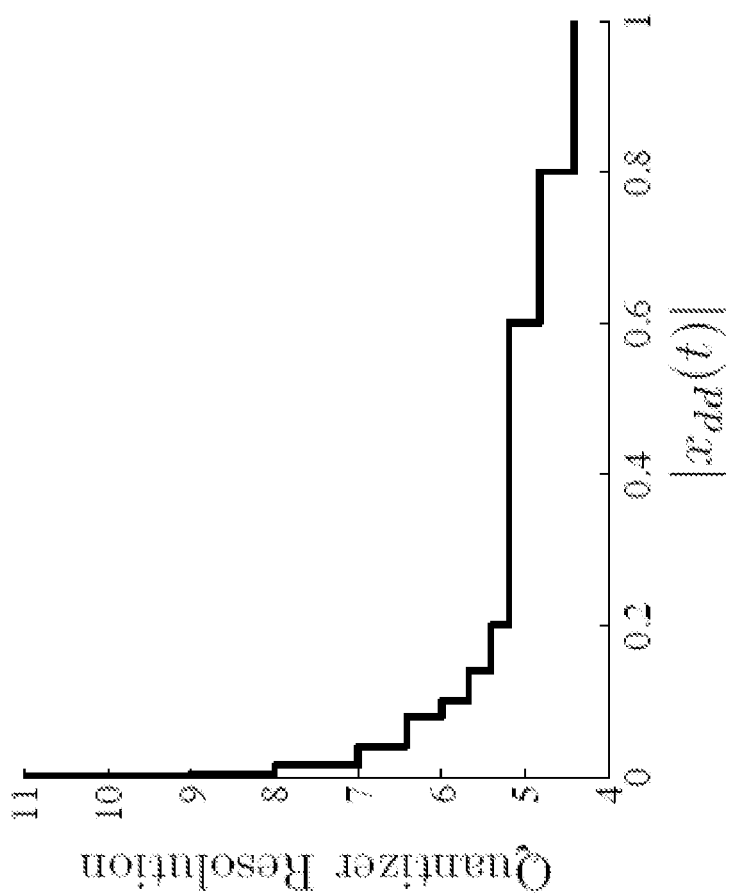
FIG. 7 shows a graph of the quantizer resolution versus the magnitude of the second derivative of the input for the system depicted in FIG. 6, according to aspects of the present disclosure.

Following this technique, a quantization-step versus second-derivative-value characteristic curve can be developed and locked into the system. An example is shown in FIG. 7; this plot was developed using the above procedure, with 60 dB SER as a target. As discussed below, the disclosed system achieves the target specification, and requires a maximum resolution of 11 bits. However, its resolution varies from 4.5 to 11 bits over the frequency band, with an average resolution of around 5.7 bits. The average resolution is calculated by first measuring the average quantization step size during quantization of sinusoids at each input frequency, and then calculating the mean of these average quantization step sizes over the entire input band.

SER Comparison

FIG. 7 shows simulations results for (a) classical LCS (5- and 10-bit); (b) DLCS (5-bit); companded DLCS (5-bit); and AR DLCS (5.7-bit). The type of reconstruction is that of a sample-and-hold for LCS, and first-order for DLCS and its variants. In the simulations, it was convenient to use FFT analysis. The analysis includes spectral components up to frequencies tens of thousands of times higher than the input frequency; so, for all practical purposes, this is consistent with the infinite bandwidth implied by the definition of MSE.

Figure 8:
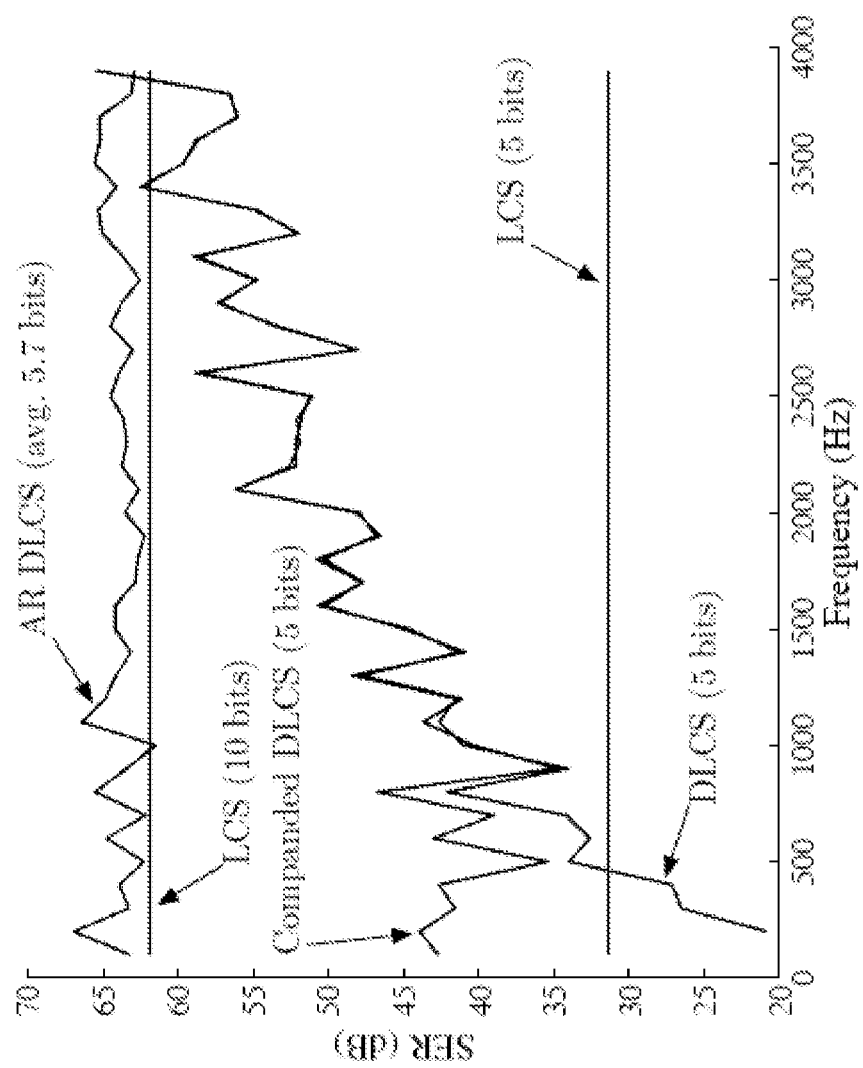
FIG. 8 shows a graph of the signal-to-error ratio for DLCS, companded DLCS, AR DLCS—where quantizer resolution varies from 4.5 to 11 bits with an average resolution of around 5.7 bits—and LCS for full-scale sinusoidal inputs.

FIG. 8 shows the SER-versus-frequency plot for the above cases. As discussed above, the AR DLCS case requires a maximum resolution of 11 bits, but its average resolution over the band is 5.7 bits, and this is the value noted on the figure. The improvement afforded by companded DLCS, compared to plain DLCS, at low frequencies is clearly visible; however, at higher frequencies the two techniques exhibit essentially the same performance, which is highly frequency-dependent. In contrast to this, AR DLCS maintains a superior SER at all frequencies, and meets the 60 dB target mentioned above in conjunction with FIG. 7.

Sample Generation and Figure of Merit

A. Figure of Merit (FOM) Definition

SER alone does not provide a complete picture of performance. The rate at which samples are generated (Ns, in samples/s) is equally important as, in event-driven systems, every generated sample has an energy cost for processing and transmission. The dynamic power dissipation of the entire system is directly proportional to Ns. This does not include static power dissipation, which depends on the details of the circuit implementation. However, the power saved by transmitting fewer packets in DLCS and its variants is expected to far outweigh the static power overhead, which today can be minimized using a variety of techniques (see, for example. Consider LCS with a sinusoidal input as a starting point, for which it is known that SER doubles for each bit of resolution increase. Ns is proportional to SER and to the input frequency, f. Equation (3) below defines a figure of merit (FOM) to make possible a fair performance comparison between the various approaches discussed:

$$FOM = \frac{N_s}{SER \times f} \quad (3)$$

For LCS, this gives a constant value independent of quantizer resolution and input frequency. For other systems, the same FOM can be used to compare them against LCS and against each other. Since we can expect the power dissipation to be roughly proportional to Ns, the above FOM is qualitatively consistent with a common FOM used to compare analog-to-digital converters. A smaller FOM value corresponds to a better performance.

For non-sinusoidal inputs, frequency f is not well-defined. For periodic inputs, it can be the inverse of the input period, but other signals, as discussed below, are not periodic. A possible frequency f in such cases is the upper frequency limit of the band of interest. Since the appropriate f to be used depends on the application, we prefer to leave it as a factor in the denominator in what follows, without assigning a value to it. This will not interfere with comparisons of systems with the same input signal; f is then a common factor in their FOM values B. Simulation Results FIG. 9 shows a table with values for SER, Ns, and FOM for 6b LCS, 6b DLCS, and 5.7b (average) AR DLCS systems for different types of inputs. DLCS and AR DLCS outperform LCS, in most cases. For the electrocardiogram (ECG) and speech input signals, DLCS shows very little improvement over LCS. This is because both these signals contain strong components at very low frequencies, which DLCS fails to quantize with enough fidelity. For sufficiently higher quantization resolution, DLCS becomes significantly better than LCS.

AR DLCS, on the other hand, shows significant improvement over LCS even with a 5.7-bit average resolution. All results shown in the table are for full-scale inputs. When the input amplitude is lowered, the FOM of DLCS and AR-DLCS stays above that of LCS for comparable resolutions for most of the input range, except for extremely small input amplitudes, at which no levels are crossed for DLCS quantization; AR DLCS, however, continues to be better than LCS even at very low amplitudes.

Simulations show that the numbers presented in the table are representative even in the presence of band-limited noise at the input, as long as the input noise power is less than the quantization error power. Addition of hysteresis reduces number of samples by avoiding excess triggering; however, this happens at the expense of SER. Simulations also show that, at very high input noise, the output SER approaches that of the input SER.

According to embodiments of the present disclosure, the differentiator can be band-limited to avoid amplification of high-frequency noise. In addition, hysteresis can be introduced in the comparators to limit excess triggering in the presence of noise. If the input to the integrator has a DC offset or very low-frequency components not present in the original signal, it can result in a local drift in the reconstructed signal that may cause a locally escalating reconstruction error. This can be caused by asymmetries in the input signal, or comparator offsets or digital-to-analog conversion nonlinearities, resulting in an asymmetric quantizer. To avoid such issues, a high-pass filter needs to precede the integrator to limit the low-frequency components of the quantized signal before reconstruction. A filter was used in the above simulations, which show less than 10% degradation of SER for up to 20% offset in comparators or up to 20% deviation in the DAC output levels. According to embodiments of the present disclosure, auto-zero techniques can also be used.

While there have been shown and described examples of the disclosed subject matter, it will be readily apparent to those skilled in the art that various changes and modifications may be readily apparent to those skilled in the art that various changes and modifications may be made therein without departing from the scope of the disclosed subject matter as defined by the appended claims. Accordingly, the disclosed subject matter is limited only by the following claims and equivalents thereto.

What is claimed is:

1. A system for reconstructing an input signal comprising:
   a differentiator configured to receive the input signal and generate a first signal representing the first derivative of the input signal;
   a level-crossing sampling block configured to receive the first signal and generate level-crossed samples;
   a zero-order holding block configured to receive the level-crossed samples and generate a quantized signal; and
   an integrator configured to receive the quantized signal and generate a second signal representing a reconstructed signal of the input signal;
   wherein the quantized signal is generated using non-uniform quantization.

2. The system of claim 1, wherein the differentiator is further configured to scale the received input signal.

3. The system of claim 1, wherein the integrator is further configured to scale the received quantized signal.

4. The system of claim 1, wherein the level-crossing sampling block is at a transmitter and the zero-order holding block is at a receiver.

5. A method for reconstructing an input signal comprising:
   receiving by a differentiator the input signal and generating a first signal representing the first derivative of the input signal;
   receiving by a level-crossing sampling block the first signal and generating level-crossed samples of the first signal;
   receiving by a zero-order holding block the level-crossed samples and generating a quantized signal; and
   receiving by an integrator the quantized signal and generating a second signal representing a reconstructed signal of the input signal;
   wherein the quantized signal is generated using non-uniform quantization.

6. The method of claim 5, wherein the differentiator is further configured to scale the received input signal.

7. The method of claim 5, wherein the integrator is further configured to scale the received quantized signal.

8. The method of claim 5, wherein the level-crossing sampling block is at a transmitter and the zero-order holding block is at a receiver.

9. A method for reconstructing an input signal comprising:
   receiving by a first differentiator the input signal and generating a first signal representing the first derivative of the input signal;
   receiving by a second differentiator the first signal and generating a second signal representing the second derivative of the input signal;
   receiving by a controller the second signal and generating a quantization step;
   receiving by a level-crossing sampling block the first signal and the quantization step and generating level-crossed samples;
   receiving by a zero-order holding block the level-crossed samples and the quantization step and generating a quantized signal; and receiving by an integrator the quantized signal and the quantization step and generating a third signal representing a reconstructed signal of the input signal.

10. The method of claim 9, further comprising scaling by the first differentiator the received input signal.

11. The method of claim 9, further comprising scaling by the second differentiator the received first input signal.

12. The method of claim 9, further comprising scaling the received quantized signal.

13. The method of claim 9, wherein the quantizer is configured to generate a small quantization step, when a magnitude of the second signal is small.

14. The method of claim 9, wherein the quantizer is configured to increase the quantization step when an absolute value of the second signal increases.

15. The method of claim 9, wherein the level-crossing sampling block is at a transmitter and the zero-order holding block is at a receiver.

16. The method of claim 9, wherein the quantizer is configured to generate the quantized signal using non-uniform quantization.

* * * * *